United States Patent [19]
Orbach et al.

[11] Patent Number: 4,875,971
[45] Date of Patent: Oct. 24, 1989

[54] FABRICATION OF CUSTOMIZED INTEGRATED CIRCUITS

[75] Inventors: Zvi Orbach; Meir I. Janai, both of Haifa, Israel

[73] Assignee: Elron Electronic Industries, Ltd., Haifa, Israel

[21] Appl. No.: 172,235

[22] Filed: Mar. 23, 1988

[30] Foreign Application Priority Data

Apr. 5, 1987 [IL] Israel ........................ 82113

[51] Int. Cl.[4] .................... B44C 1/22; C23F 1/02; C03C 15/00; H01L 21/306
[52] U.S. Cl. ..................... 156/644; 156/651; 156/653; 156/656; 156/657; 156/659.1; 357/71; 428/209; 428/446; 428/622; 428/633; 437/56; 437/195
[58] Field of Search ............. 156/644, 651, 652, 653, 156/656, 657, 659.1; 437/203, 228, 238, 245, 246, 51, 56, 57, 58, 59, 189, 190, 192, 195; 357/55, 65, 67, 71; 428/131, 209, 446, 450, 596, 601, 620, 622, 627, 632, 633

[56] References Cited

U.S. PATENT DOCUMENTS

| | | | |
|---|---|---|---|
| 3,731,375 | 5/1973 | Agusta et al. | 437/246 X |
| 3,740,523 | 6/1973 | Cohen et al. | 219/121.85 |
| 3,769,108 | 10/1973 | Feldman et al. | 437/246 X |
| 4,124,899 | 11/1978 | Birkner et al. | 364/716 |
| 4,197,555 | 4/1980 | Uebara et al. | 357/70 |
| 4,217,393 | 8/1980 | Staebler et al. | 428/450 |
| 4,233,671 | 11/1980 | Gerzberg et al. | 365/105 |
| 4,238,839 | 12/1980 | Redfern et al. | 365/96 |
| 4,240,094 | 12/1980 | Mader | 357/45 |
| 4,259,367 | 3/1981 | Dougherty, Jr. | 427/96 |
| 4,289,846 | 9/1981 | Parks | 430/314 |
| 4,308,090 | 12/1981 | Te Velde et al. | 156/652 |
| 4,321,104 | 3/1982 | Hasegawa et al. | 156/643 |
| 4,325,181 | 4/1982 | Yoder | 437/246 X |
| 4,356,504 | 10/1982 | Tozun | 357/42 |
| 4,387,503 | 6/1983 | Aswell et al. | 357/86 X |
| 4,389,429 | 6/1983 | Soclof | 156/647 X |
| 4,412,237 | 10/1983 | Matsumura et al. | 357/42 |
| 4,450,041 | 5/1984 | Aklufi | 156/628 |
| 4,455,194 | 6/1984 | Yabu et al. | 156/656 X |
| 4,455,495 | 6/1984 | Masuhara et al. | 357/41 X |
| 4,476,478 | 10/1984 | Noguchi et al. | 357/41 |
| 4,520,554 | 6/1985 | Fisher | 29/591 |
| 4,536,249 | 8/1985 | Rhodes | 156/643 |
| 4,536,949 | 8/1985 | Takayama et al. | 29/578 |
| 4,561,906 | 12/1985 | Calder et al. | 357/67 X |
| 4,581,628 | 4/1986 | Miyauchi et al. | 357/71 |
| 4,585,490 | 4/1986 | Raffel et al. | 357/91 X |
| 4,590,589 | 5/1986 | Gerzberg | 365/100 |
| 4,601,778 | 7/1986 | Robb | 156/628 |
| 4,602,420 | 7/1986 | Saito | 427/53.1 |
| 4,628,590 | 12/1986 | Udo et al. | 357/51 |
| 4,632,725 | 12/1986 | Hartmann et al. | 156/656 X |

(List continued on next page.)

FOREIGN PATENT DOCUMENTS

| | | |
|---|---|---|
| 0089814 | 9/1983 | European Pat. Off. . |
| 0111128 | 6/1984 | European Pat. Off. . |
| 0210397 | 2/1987 | European Pat. Off. . |
| 61678 | 4/1984 | Israel . |
| 5048926 | 4/1980 | Japan . |
| 89476 | 6/1982 | Japan . |
| 58157 | 1/1983 | Japan . |
| 060650 | 4/1983 | Japan . |
| 067042 | 4/1983 | Japan . |
| 85550A | 5/1983 | Japan . |
| 194740 | 8/1986 | Japan . |
| 2170649 | 8/1986 | United Kingdom . |

OTHER PUBLICATIONS

IBM Technical Disclosure Bulletin, Wet Etching for Line Deletion . . . , vol. 27, Mar. 1985.
D. Bursky, Semiconductor Technology, Electronic Design, No. 12, Jun. 1984.

(List continued on next page.)

Primary Examiner—William A. Powell
Attorney, Agent, or Firm—Browdy and Neimark

[57] ABSTRACT

A technique for production of customized integrated circuits comprising the steps of providing an integrated circuit blank having at least first and second metal layers including portions arranged for selectable removal to provide desired customization of said integrated circuit blank, and thereafter etching at least said first metal layer to customize said integrated circuit blank.

50 Claims, 6 Drawing Sheets

U.S. PATENT DOCUMENTS

| | | | |
|---|---|---|---|
| 4,636,404 | 1/1987 | Raffel et al. | 427/53.1 |
| 4,651,190 | 3/1987 | Suzuki et al. | 357/45 |
| 4,665,295 | 5/1987 | McDavid | 219/121.85 |
| 4,691,434 | 9/1987 | Percival et al. | 437/173 |
| 4,692,786 | 9/1987 | Lindenfelser | 357/54 |
| 4,700,214 | 10/1987 | Johnson | 357/68 |
| 4,717,689 | 1/1988 | Maas et al. | 437/225 |
| 4,718,977 | 1/1988 | Contiero et al. | 156/656 X |
| 4,720,470 | 1/1988 | Johnson | 437/173 |
| 4,720,908 | 1/1988 | Wills | 437/192 |
| 4,740,485 | 4/1988 | Sharpe-Geisler | 437/246 |
| 4,751,197 | 6/1988 | Wills | 437/174 |
| 4,758,745 | 7/1988 | Elgamal et al. | 307/465 |
| 4,783,424 | 11/1988 | Ohno et al. | 437/40 |
| 4,800,179 | 1/1989 | Mukai | 437/203 |

OTHER PUBLICATIONS

Garrison et al., Laser Ablation of Organic Polymers, Journal of Applied Physics, No. 8, Apr. 1985.

M. J. Bowden, Forefront of Research on Resists, Solid State Technology, Jun. 1981.

I. Adesida, Ion Bombardment of Resists, Nuclear Instruments in Physics Research, vols. 209/210, May 1983, Part 1.

T. McGrath, Applications of Examiner Lasers in Microelectrics, Solid State Technology, No. 12, Dec. 1983.

J. J. Gadja et al., IBM Disclosure Bulletin, vol. 21, No. 12, May, 1979, Selective Conversion of Films . . . .

C. Fiori et al., High Resolution Ultraviolet Photoablation of SiOx Films, Applied Physics Letters, Aug. 1985, No. 4.

D. B. Tuckerman et al., Laser Planarization, Solid State Technology, Apr., 1986.

D. Smart, Optimization of Semiconductor Layer Thicknesses for Repair of RAMs.

B. C. Cole, Laser Micromachining Brings Quick Prototypes, Electronics, Nov. 12, 1987.

P. Martin et al., Observation of Exceptional Temperature Humidity Stability . . . , Applied Optics, vol. 23, No. 9, May, 1984.

S. K. Ghandi, VLSI Fabrication Principles, A Wiley Interscience Publication.

D. Platteter, Basic Integrated Circuit Failure Analysis Techniques.

J. Melngailis et al., The Focused Ion Beam as an Integrated . . . , J. Vac. Sci. Technol. B., vol. 4, No. 1, Jan./Feb. 1988.

J. Logue et al., Techniques for Improving Engineering Productivity . . . , IBM J. Res. Develop., vol. 25, No. 3, May 1981.

J. I. Raffel et al., Laser-Formed Connections Using Polyimide.

J. A. Yasaitis et al., Low Resistance Laser Formed Lateral Links, 1982, IEEE.

J. I. Raffel et al., A Demonstration of Very Large Area . . . , 1983 IEEE.

J. C. North et al., Laser Coding of Bipolar Read-Only Memories, IEEE Journal of Solid State Circuits, Aug. 1976.

J. C. North, Laser Vaporization of Metal Films . . . , J. of Applied Physics, vol. 48, No. 6, Jun. 1977.

J. I. Raffel et al., A Wafer-Scale Digital Integrator . . . , IEEE J. of Solid-State Circuits, vol. SC-20, No. 1, Feb. 1985.

S. Wolf et al., Silicon Processing for the VLSI Era, vol. 1, Process Technology.

M. Briska et al., Production and Application of Polysilicon Masks, IBM Technical Disclosure Bulletin, vol. 23, No. 1, Jun. 1980.

Lasers for Microelectronics, Florod Corporation.

Model 8000, Laser Programming System: The High Yield Solution.

Florod Lasers for Microelectronics, Advancing Laser Technology.

Computer Design, Mar. 1984.

R. L. Waters et al., A Laser Cutter for Failure Analysis, 1983 Proceedings of International Symposium for Testing & Failure Analysis.

S. Kazami et al., CMOS Gate-Array . . . , EDN, Oct. 31, 1984.

Technology Report, Laser Focus/Electro-Optics, Apr. 1984.

McWilliams et al., Appl. Phys. Lett., 43(10), Nov. 1983.

Industry News, Semiconductor International, Nov. 1983.

FABRICATION OF CUSTOMIZED INTEGRATED CIRCUITS

FIELD OF THE INVENTION

The present invention relates to fabrication of integrated circuits and more particularly to techniques associated with the fabrication of integrated circuits.

BACKGROUND OF THE INVENTION

In the fabrication of prototype integrated circuits, particularly gate arrays of the double metal layer C-MOS type, prepared wafers are prepared using conventional mass production techniques. The upper four layers of the prototype integrated circuits are left to be specifically configured to a particular application. These layers include a contact layer having apertures through which contact is established with semiconductors disposed therebelow, a metal I layer disposed over the contact layer, an insulation layer, termed a via layer, having apertures through which contact is established with the metal I layer, and a metal II layer, which is the upper metal layer of the integrated circuit.

Normally a passivation layer, such as $SiO_2$, is provided over the metal II layer for mechanical protection as well as electrical insulation of the integrated circuit.

Upon definition of a specific application for a prototype integrated circuit, the following steps are carried out:

The contact layer is covered with photoresist.

A specific mask formed for a given application for contact layer configuration is used to expose the photoresist overlying the contact layer in order to expose all of the required contacts which define electrical connections with underlying semiconductor devices.

The unwanted regions of photoresist are removed.

The portions of the contact layer underlying the regions at which photoresist has been removed are etched.

The remaining photoresist is removed.

The contact layer may be pre-configured and thus the above steps may form part of the mass production phase and not part of the specific configuration for specific applications.

After configuration of the contact layer, the metal I layer is deposited and the following steps are carried out:

The metal I layer is covered with photoresist.

A specific mask formed for a given application for metal I configuration is used to expose the photoresist overlying the metal I layer in order to form all of the required metal I lines which define electrical connections with underlying semiconductor devices.

The unwanted regions of photoresist are removed.

The portions of the metal I layer underlying the regions at which photoresist has been removed are etched.

The remaining photoresist is removed.

After configuration of the metal I layer, the via layer is deposited and the following steps are carried out:

The via layer is covered with photoresist.

A specific mask formed for a given application for via configuration is used to expose the photoresist overlying the via layer in order to expose all of the required contacts which define electrical connections with the underlying metal I layer.

The unwanted regions of photoresist are removed.

The portions of the via layer underlying the regions at which photoresist has been removed are etched.

The remaining photoresist is removed.

After configuration of the via layer, the metal II layer is deposited and the following steps are carried out:

The metal II layer is covered with photoresist.

A specific mask formed for a given application for metal II configuration is used to expose the photoresist overlying the metal II layer in order to form all of the required interconnects which define electrical connections with the underlying metal I lines.

The unwanted regions of photoresist are removed.

The portions of the metal II layer underlying the regions at which photoresist has been removed are etched.

The remaining photoresist is removed.

Following configuration of the metal II layer, the passivation layer is deposited and then typically configured using a general purpose mask in order to define windows in the passivation layer for circuit pads to which leads are connected, for electrical connections to the integrated circuit.

SUMMARY OF THE INVENTION

The present invention seeks to provide a technique for production of customized integrated circuits from finished integrated circuit blanks whereby it is possible to selectively remove portions of the metal conductor at a plurality of metal layers in the finished integrated circuit blank using a single mask.

There is thus provided in accordance with a preferred embodiment of the present invention a technique for production of customized integrated circuits comprising the steps of providing an integrated circuit blank having at least first and second metal layers including portions arranged for selectable removal to provide desired customization of said integrated circuit blank, and thereafter etching at least said first metal layer to customize said integrated circuit blank.

Further in accordance with a preferred embodiment of the present invention, there is provided a technique for production of customized integrated circuits comprising the steps of providing an integrated circuit blank having at least one metal layer, etching said at least one metal layer to define a pattern of conductors including portions arranged for selectable removal, and thereafter etching said at least one metal layer a second time to customize said integrated circuit blank by selectable removal of said at least one metal layer at selected ones of said portions.

Further in accordance with a preferred embodiment of the present invention, there is provided a technique for production of customized integrated circuits comprising the steps of providing an integrated circuit blank by providing a first photoresist layer over a metal layer on a substrate and etching said metal layer through exposed locations in said first photoresist layer and providing a second photoresist layer over said etched metal layer.

Still further in accordance with a preferred embodiment of the present invention, there is provided a semiconductor device comprising a blank including at least first and second metal layers including portions arranged for selectable removal to provide desired customization of said blank.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Reference is now made to FIGS. 1-3D, which illustrate a technique for manufacture of a customized integrated circuit in accordance with a preferred embodiment of the present invention.

Figure 1:
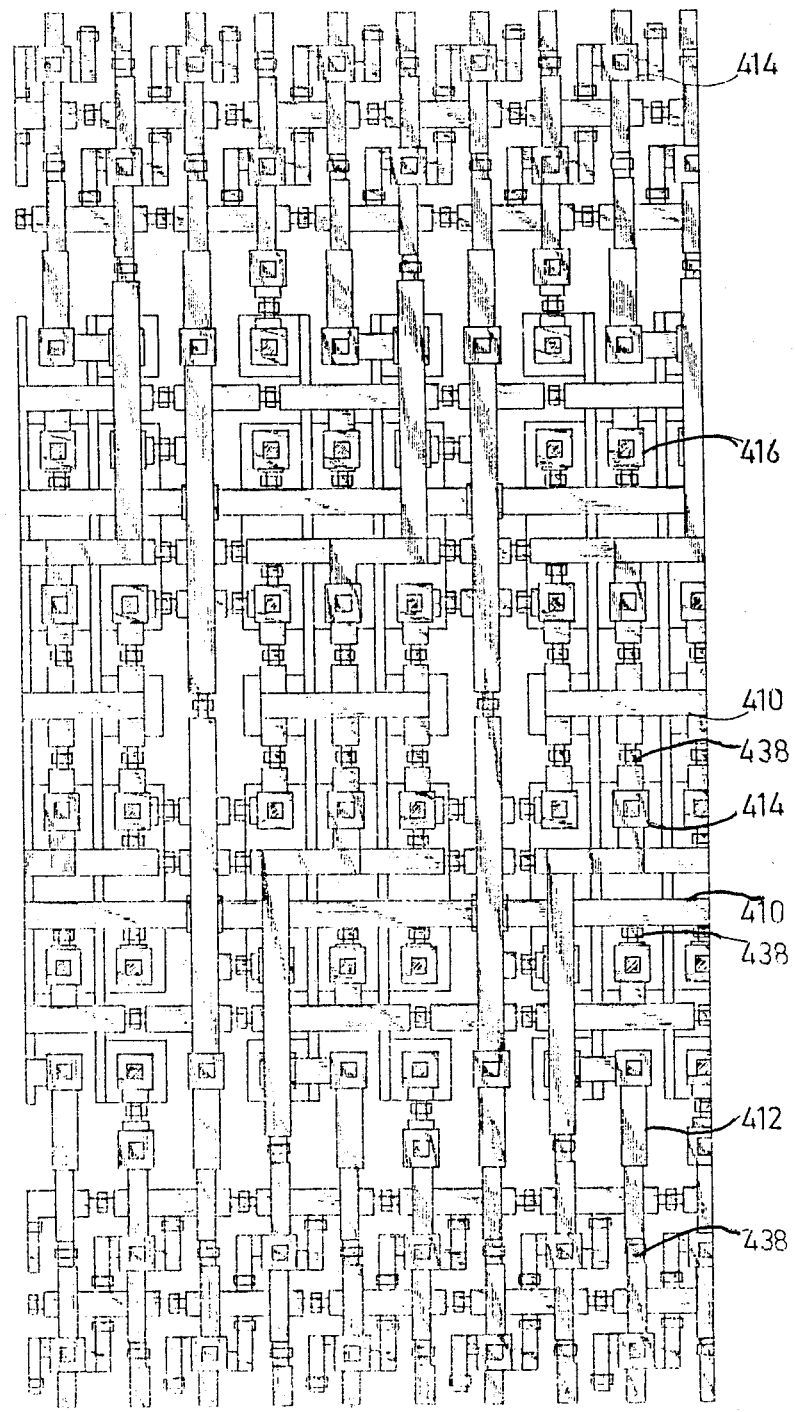
FIG. 1 is a pictorial overlay illustrating the layout of a portion of a customizable array useful in an embodiment of the present invention.
Figure 2:
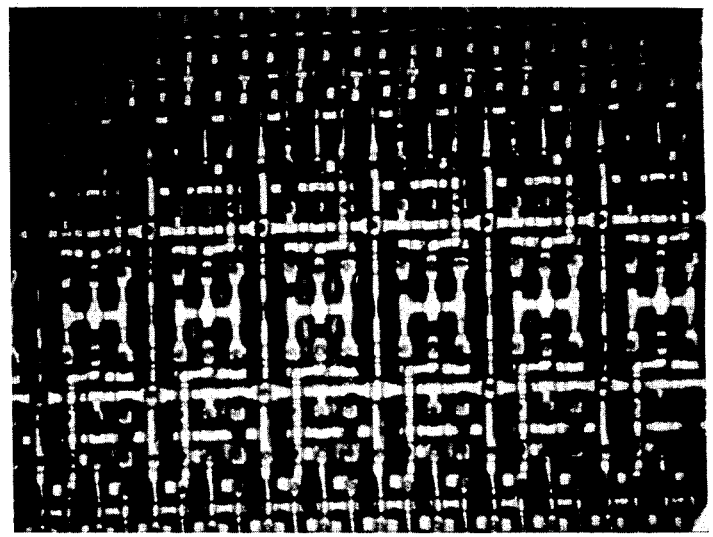
FIG. 2 is a photomicrograph of the array illustrated in FIG. 1.

Specifically considering FIGS. 1 and 2, a portion of a customizable integrated circuit blank is seen wherein strips of the metal I layer 410 and of the metal II layer 412 are generally arranged in mutually perpendicular orientation so as to define a grid. Vias interconnecting the metal I and metal II layers are indicated at reference numeral 414 and contacts for the connection of external leads are indicated at reference numeral 416.

The metal I and metal II layers 410 and 412 are separated by insulative material, not shown, which prevents electrical contact therebetween, except at vias 414.

Figure 3A:
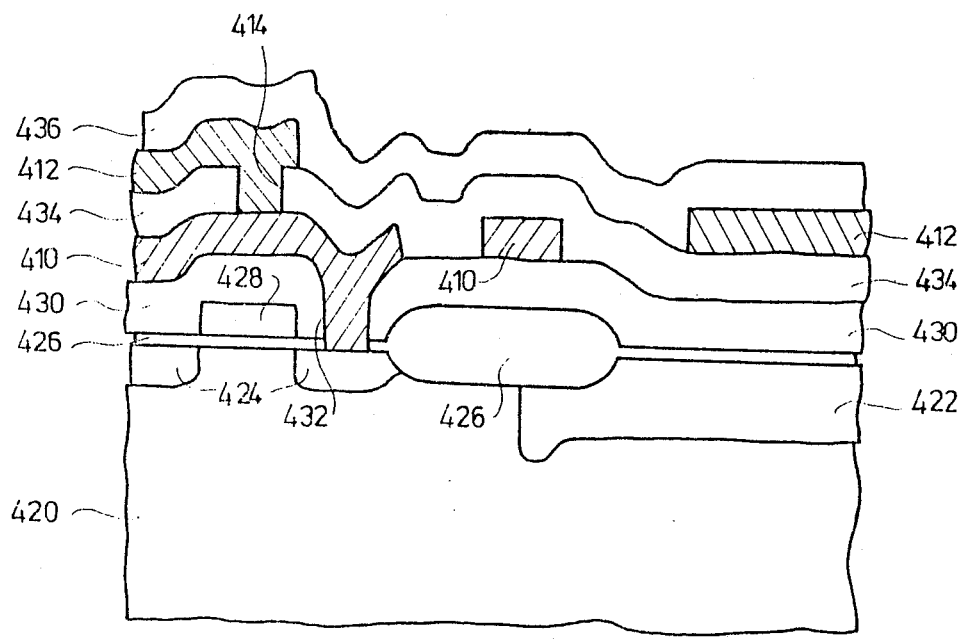
FIGS. 3A-3D are illustrative sectional views representing the various stages of a technique provided in accordance with one embodiment of the present invention.

The arrangement of the various layers may be additionally appreciated from a consideration of FIG. 3A, which illustrates in section a portion of an integrated circuit blank. The blank includes a substrate 420 onto which is formed semiconductor material layers 422, 424, 426 and 428. A contact layer 430 is formed thereover.

A metal I layer 410 is formed over the contact layer and defines a contact 432 in electrical contact with semiconductor material 424. A via layer 434 is shown disposed over metal I layer 410, and metal II layer 412 is shown disposed over via layer 434 and extending therethrough at vias 414 into electrical contact with the metal I layer 410. A passivation layer 436 is formed over the metal II layer 412 and the via layer 434, where exposed.

It is a particular feature of the present invention that the various layers are configured such that the metal I and metal II layers are always exposed for etching at locations where removal thereof may be desired. This is seen from a consideration of FIG. 1, which shows a multiplicity of potential removal regions 438 wherein those potential removal regions for the metal I layer are not covered with the metal II layer.

The technique of the present invention will now be described with particular reference to FIGS. 3A-3D. The configuration illustrated in FIG. 3A and described hereinabove is characteristic of a integrated circuit blank which is ready for single mask specific configuration in accordance with a preferred embodiment of the invention.

Figure 3B:
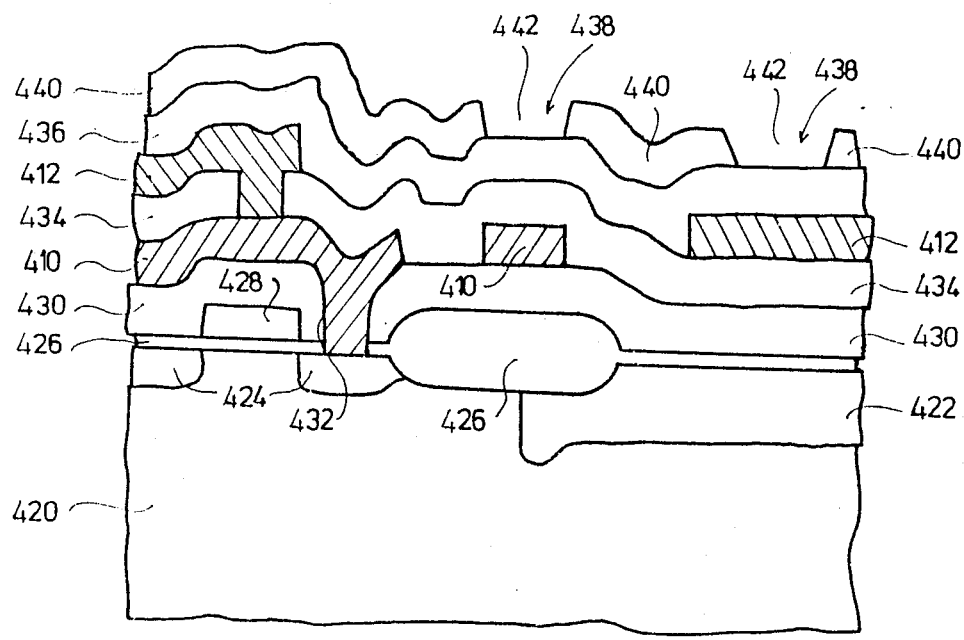

In accordance with the present invention, as illustrated in FIG. 3B, a photoresist layer 440 is deposited over the passivation layer 436. Then, in accordance with a preferred embodiment of the present invention, an application-specific mask may be used to expose the photoresist layer 440 and to define openings 442 in the photoresist layer. This application-specific mask defines openings 442 at desired regions selected from the potential removal regions 438 which are called for by the given application.

Figure 3C:
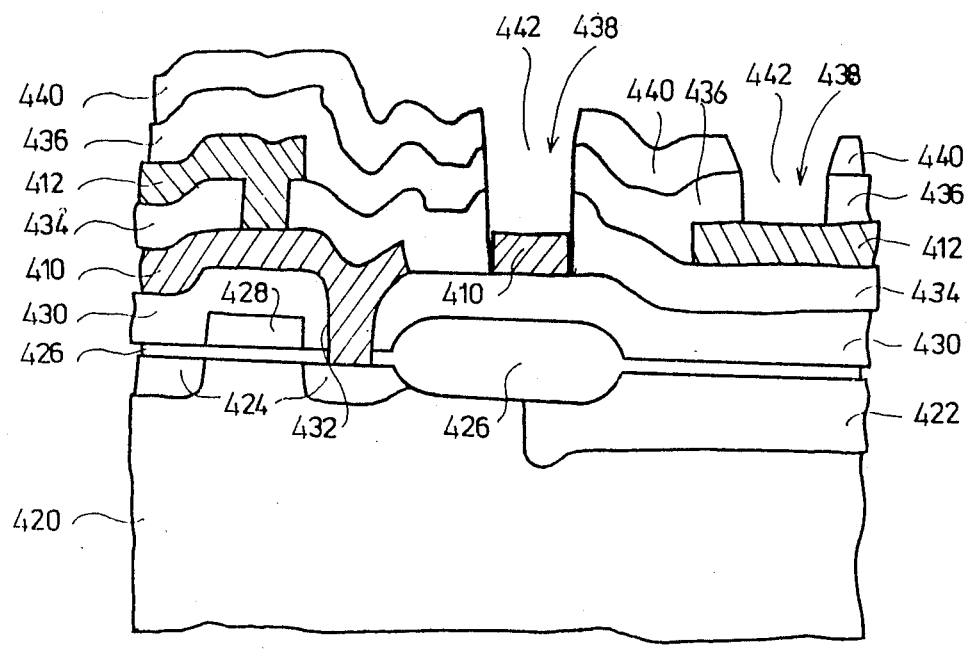

Following exposure of the photoresist layer, the photoresist overlying the selected removal regions 438 is removed, thereby defining the openings 442. The passivation layer 436 and the via layer 434, where present, are removed, as by etching at the regions defined by openings 442. The result of such removal is illustrated in FIG. 3C.

The metal layers, which typically include both metal I and metal II layers, are then removed at the regions underlying openings 442, as by etching. The result of this removal is illustrated in FIG. 3D and provides an application specific integrated circuit in accordance with the present invention.

Figure 3D:
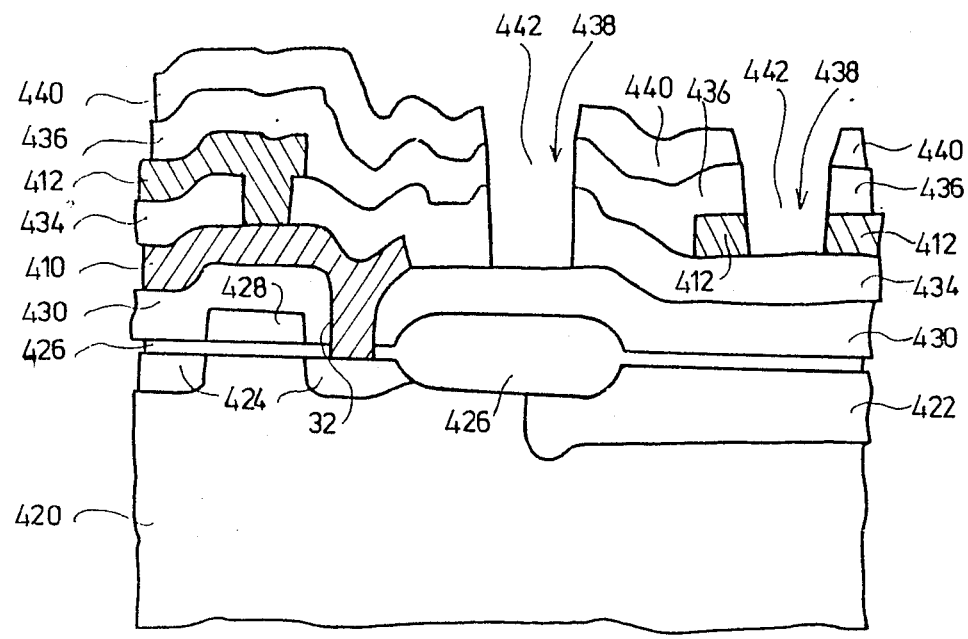

If desired, an additional passivation layer may be added over the integrated circuit in the form illustrated in FIG. 3D.

Figure 4:
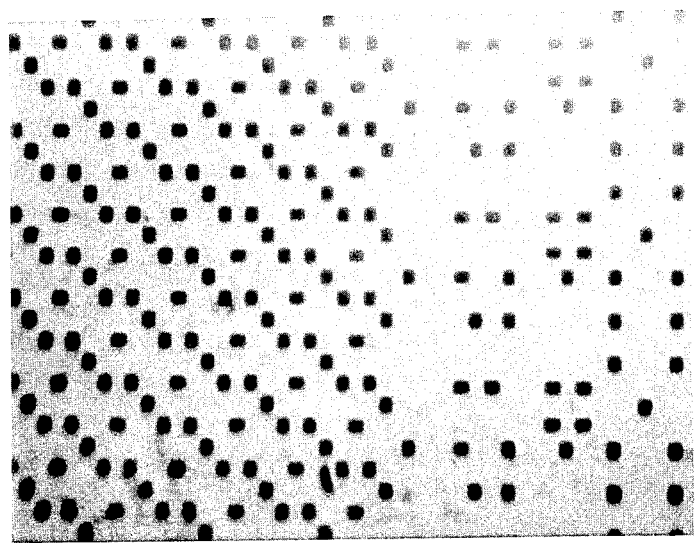
FIG. 4 illustrates a generalized mask useful in one embodiment of the present invention.

According to an alternative embodiment of the present invention, a generalized mask, such as that illustrated in FIG. 4, may be used to expose photoresist layer 440 at all of the potential removal regions 438. Thereafter the photoresist at the exposed region is removed and the passivation 436 and the via layer 434, where present, are etched at all of the exposed potential removal regions 438. The etched wafers are then covered once again with photoresist. Only thereafter is a single application-specific mask used to define those potential removal regions 438 at which metal I and/or metal II is to be removed.

One advantage of this alternative technique, particularly when a precisely formed general mask of the type illustrated in FIG. 4 is employed, is that the subsequently used single mask need not be as precise in its pattern definitions of the region to be removed, since the configuration of all of the potential removal regions has already been precisely defined by the general mask. As a further alternative, the general mask may in fact be comprised of a plurality of general masks, each specifically configured for a given metal layer, which masks are sequentially exposed.

It is a particular feature of the present invention that openings 442 define windows which relate to a particular predetermined customized configuration of a mass-produced, relatively general purpose integrated circuit blank. It is also a particular feature of the present invention that a plurality of metal layers are etched simultaneously.

In accordance with a prefered embodiment of the present invention the mask may be produced by laser radiation of chrome or any other suitable material. According to one embodiment of the invention, the application-specific single mask may be generated from the general mask by blocking the regions corresponding to non-selected potential removal regions 438.

It will be appreciated by persons skilled in the art that the present invention is not limited by what has been particularly shown and described above and is defined only by the claims which follow:

We claim:

1. A technique for production of customized integrated circuit gate arrays comprising the steps of:

providing an integrated circuit gate array blank having at least a first metal layer and a second metal layer formed over said first metal layer and separated therefrom by an insulator, said first and second metal layers including portions arranged for selectable removal to provide desired customization of said integrated circuit blank; and thereafter etching at least said first metal layer to customize said integrated circuit gate array blank.

2. A technique according to claim 1 and wherein said etching step comprises simultaneous etching of all desired locations on each of said at least said first metal layer.

3. A technique according to claim 1 and wherein said etching step comprises the step of simultaneously etching said first and second metal layers to customize said integrated circuit blank.

4. A technique for production of customized integrated circuit gate arrays comprising the steps of:
   providing an integrated circuit gate array blank having at least one metal layer;
   etching said at least one metal layer to define a pattern of conductors including portions arranged for selectable removal;
   providing a passivation layer over said at least one metal layer; and
   etching said at least one metal layer a second time to customize said integrated circuit gate array blank by selectable removal of said at least one metal layer at selected ones of said portions.

5. A technique according to claim 4 and wherein said step of etching said at least one metal layer a second time comprises simultaneous etching of all desired locations on each of said at least one metal layers.

6. A technique according to claim 4 and also comprising the step of depositing a non-metallic layer over said at least one metal layer prior to etching said at least one metal layer a second time.

7. A technique according to claim 6 and wherein said step of etching said at least one metal layer a second time comprises simultaneous etching of all desired locations on each of said at least one metal layers.

8. A technique according to claim 1 and wherein said step of providing includes the step of forming an etch resistant layer over said integrated circuit blank using a mask which defines etchable windows over all portions of said first metal layer sought to be removed in a predetermined customization configuration.

9. A technique according to claim 4 and wherein said step of providing includes the step of forming an etch resistant layer over said integrated circuit blank using a mask which defines etchable windows over all portions of said at least one metal layer sought to be removed in a predetermined customization configuration.

10. A technique according to claim 1 and also comprising the step of forming an etch resistant layer over said integrated circuit blank using an etchable window mask which defines etchable windows over all portions of at least one of said first and second metal layers sought to be removed in a predetermined customization configuration, prior to etching.

11. A technique according to claim 4 and also comprising the step of forming an etch resistant layer over said integrated circuit blank using an etchable window mask which defines etchable windows over all portions of said at least one metal layer sought to be removed in a predetermined customization configuration, prior to etching.

12. A technique according to claim 1 and also comprising the step of forming an etch resistant layer over said integrated circuit blank using an etchable window mask to define etchable windows over portions of at least one of said first and second metal layers which could be removed in a predetermined customization configuration, prior to etching.

13. A technique according to claim 4 and also comprising the step of forming an etch resistant layer over said integrated circuit blank using an etchable window mask to define etchable windows over portions of said at least one metal layer which could be removed in a predetermined customization configuration, prior to etching.

14. A technique according to claim 8 and wherein said step of forming an etch resistant layer comprises the step of forming an insulating layer over said first metal layer.

15. A technique according to claim 10 and wherein said step of forming an etch resistant layer comprises the step of forming an insulating layer over said first metal layer.

16. A technique according to claim 12 and wherein said step of forming an etch resistant layer comprises the step of forming an insulating layer over said first metal layer.

17. A technique according to claim 9 and wherein said step of forming an etch resistant layer comprises the step of forming an insulating layer over said at least one metal layer.

18. A technique according to claim 11 and wherein said step of forming an etch resistant layer comprises the step of forming an insulating layer over said at least one metal layer.

19. A technique according to claim 13 and wherein said step of forming an etch resistant layer comprises the step of forming an insulating layer over said at least one metal layer.

20. A technique according to claim 8 and wherein said step of forming an etch resistant layer also comprises the step of forming a photoresist layer over at least said second metal layer.

21. A technique according to claim 10 and wherein said step of forming an etch resistant layer also comprises the step of forming a photoresist layer over at least said second metal layer.

22. A technique according to claim 12 and wherein said step of forming an etch resistant layer also comprises the step of forming a photoresist layer over at least said second metal layer.

23. A technique according to claim 9 wherein said step of forming an etch resistant layer also comprises the step of forming a photoresist layer over said at least one metal layer.

24. A technique according to claim 11 and wherein said step of forming an etch resistant layer also comprises the step of forming a photoresist layer over said at least one metal layer.

25. A technique according to claim 13 and wherein said step of forming an etch resistant layer also comprises the step of forming a photoresist layer over said at least one metal layer.

26. A technique according to claim 2 and wherein said simultaneous etching step comprises the step of etching said at least first and second metal layers a second time to customize said integrated circuit blank by selectable removal of said at least first and second metal layers at selected ones of said portions arranged for selected removal.

27. A technique according to claim 3 and wherein said simultaneous etching step comprises the step of etching said at least first and second metal layers a second time to customize said integrated circuit blank by selectable removal of said at least first and second metal layers at selected ones of said portions arranged for selectable removal.

28. A technique according to claim 1 and wherein said etching step for customizing said integrated circuit blank comprises the step of generating at least one customizing mask.

29. A technique according to claim 4 and wherein said etching step for customizing said integrated circuit blank comprises the step of generating at least one customizing mask.

30. A technique according to claim 28 and wherein said step of generating at least one customizing mask comprises the step of laser irradiation of a mask material.

31. A technique according to claim 29 and wherein said step of generating at least one customizing mask comprises the step of laser irradiation of a mask material.

32. A technique according to claim 12 and wherein said etching step for customizing said integrated circuit blank comprises the step of generating at least one customizing mask and wherein said step of generating at least one customizing mask comprises the step of laser irradiation of said etchable window mask.

33. A technique according to claim 13 and wherein said etching step for customizing said integrated circuit blank comprises the step of generating at least one customizing mask and wherein said step of generating at least one customizing mask comprises the step of laser irradiation of said etchable window mask.

34. A technique according to claim 8 and wherein said etch resistant layer comprises photoresist.

35. A technique according to claim 9 and wherein said etch resistant layer comprises photoresist.

36. A technique according to claim 10 and wherein said etch resistant layer comprises photoresist.

37. A technique according to claim 11 and wherein said etch resistant layer comprises photoresist.

38. A technique according to claim 12 and wherein said etch resistant layer comprises photoresist.

39. A technique according to claim 13 and wherein said etch resistant layer comprises photoresist.

40. A technique according to claim 12 and wherein said etching step for customizing said integrated circuit blank comprises the step of generating at least one customizing mask and wherein said step of generating at least one customizing mask comprises the step of ion beam irradiation of said etchable window mask.

41. A technique according to claim 13 and wherein said etching step for customizing said integrated circuit blank comprises the step of generating at least one customizing mask and wherein said step of generating at least one customizing mask comprises the step of ion beam irradiation of said etchable window mask.

42. A technique according to claim 1 and wherein said first metal layer is a metal I layer and said second metal layer is a metal II layer.

43. A semiconductor device formed in accordance with a technique comprising the steps of:
providing an integrated circuit blank having at least a first metal layer and a second metal layer formed over said first metal layer and separated therefrom by an insulator, said first and second metal layers including portions arranged for selectable removal to provide desired customization of said integrated circuit blank; and thereafter
etching at least said first metal layer to customize said integrated circuit blank.

44. An integrated circuit gate array formed in accordance with a technique comprising the steps of:
providing an integrated circuit gate array blank having at least a first metal layer and a second metal layer formed over said first metal layer and separated therefrom by an insulator, said first and second metal layers including portions arranged for selectable removal to provide desired customization of said integrated circuit blank; and thereafter
etching at least said first metal layer to customize said integrated circuit gate array blank.

45. An integrated circuit gate array formed in accordance with a technique comprising the steps of:
providing an integrated circuit gate array blank having at least one metal layer;
etching said at least one metal layer to define a pattern of conductors including portions arranged for selectable removal;
providing a passivation layer over said at least one metal layer; and
etching said at least one metal layer a second time to customize said integrated circuit gate array blank by selectable removal of said at least one metal layer at selected ones of said portions.

46. A semiconductor device formed in accordance with a technique comprising the steps of:
providing an integrated circuit blank having at least one metal layer;
etching said at least one metal layer to define a pattern of conductors including portions arranged for selectable removal;
providing a passivation layer over said at least one metal layer; and
etching said at least one metal layer a second time to customize said integrated circuit blank by selectable removal of said at least one metal layer at selected ones of said portions.

47. A semiconductor device comprising a gate array blank including at least a first metal layer and a second metal layer formed over said first metal layer and separated therefrom by an insulator, said first and second metal layers including portions arranged for selectable removal to provide desired customization of said blank, said insulator being formed with openings overlying regions of said first metal layer to be selectably removed.

48. A semiconductor device according to claim 47 and also comprising an etch resistant layer formed over at least said first metal layer and having formed therein windows located over all portions of said at least said first metal layer sought to be removed in a predetermined customization configuration.

49. A semiconductor device according to claim 47 and wherein said first metal layer is a metal I layer and said second metal layer is a metal II layer.

50. A technique according to claim 1 and also including, prior to etching, the step of providing a photoresist layer which contacts locations on both said first and second metal layers.

* * * * *